(12) United States Patent
Chiola et al.

(10) Patent No.: US 7,858,456 B2
(45) Date of Patent: Dec. 28, 2010

(54) MERGED P-I-N SCHOTTKY STRUCTURE

(75) Inventors: Davide Chiola, Marina del Rey, CA (US); Kohji Andoh, El Segundo, CA (US); Silvestro Fimiani, Turin (IT)

(73) Assignee: Siliconix Technology C. V., Singapore (SG)

( * ) Notice: Subject to any disclaimer, the term of this patent is extended or adjusted under 35 U.S.C. 154(b) by 0 days.

(21) Appl. No.: 11/402,039

(22) Filed: Apr. 11, 2006

(65) Prior Publication Data

US 2006/0189107 A1 Aug. 24, 2006

Related U.S. Application Data

(62) Division of application No. 10/766,466, filed on Jan. 27, 2004, now Pat. No. 7,071,525.

(51) Int. Cl.
*H01L 21/338* (2006.01)

(52) U.S. Cl. .............. 438/167; 438/169; 438/174; 257/E51.009

(58) Field of Classification Search ......... 438/292–308, 438/167, 169, 174
See application file for complete search history.

(56) References Cited

U.S. PATENT DOCUMENTS

| 6,294,445 | B1 * | 9/2001 | Bol et al. ............. 438/534 |
| 6,524,900 | B2 | 2/2003 | Dahlqvist et al. |
| 2004/0061195 | A1 * | 4/2004 | Okada et al. ............. 257/477 |
| 2004/0212011 | A1 * | 10/2004 | Ryu ............. 257/335 |

FOREIGN PATENT DOCUMENTS

| JP | 03-024767 | 2/1991 |
| JP | 10-117003 | 5/1998 |

\* cited by examiner

*Primary Examiner*—Wai-Sing Louie

(57) ABSTRACT

Merged P-i-N Schottky device in which the oppositely doped diffusions extend to a depth and have been spaced apart such that the device is capable of absorbing a reverse avalanche energy comparable to a Fast Recovery Epitaxial Diode having a comparatively deeper oppositely doped diffusion region.

17 Claims, 5 Drawing Sheets

MERGED P-I-N SCHOTTKY STRUCTURE

CROSS-REFERENCE TO RELATED APPLICATION

This application is a divisional of U.S. patent application Ser. No. 10/766,466, filed Jan. 27, 2004 in the name of Davide Chiola, Kohji Andoh and Silvestro Fimiani and entitled MERGED P-i-N SCHOTTKY STRUCTURE, the entire contents of which are incorporated herein by reference

FIELD OF THE INVENTION

This invention is related to semiconductor devices and more particularly to a Merged P-i-N Schottky (MPS) diode.

BACKGROUND OF THE INVENTION

FIG. 1A shows the cross-section of a Fast Recovery Epitaxial Diode (FRED) 10 according to the prior art. FRED 10 comprises a lightly-doped N⁻ silicon epitaxial layer 12 which is formed on a highly doped N+ silicon substrate 14. A p+ doped diffusion well 16 is formed on a portion of the upper region of epitaxial layer 12. FRED 10 includes first major electrode 18 that is in surface-to-surface contact with diffusion well 16 and silicon dioxide layer 20 which surrounds and is partially in contact with the outer periphery of diffusion well 16. FRED 10 also includes second major electrode 22 which is disposed on a surface of silicon substrate 14 opposing first major electrode 18 of FRED 10.

Diffusion well 16 of FRED 10 is relatively shallow and may range between 3 µm to 6 µm for 200-600 volt devices. It has been found that 3 µm-6 µm deep diffusion well 16 provides a good tradeoff between performance and manufacturing complexity. However, devices having shallow diffusion wells do not have the capability to absorb reverse avalanche energy well.

The difference between the bulk breakdown voltage (BV), which represents the ideal breakdown voltage for a planar junction, and the actual BV for a FRED has been used to isolate the reason for the inability of FRED 10 to satisfactorily absorb reverse avalanche energy.

Referring, for example, to Table 1, FRED 10 which has a 6 µm deep diffusion well 16 can have an actual device BV that may be between 36-70 volts lower than bulk BV. It should be noted that although the thickness of the epitaxial layer 12 contributes to the difference between the bulk BV and the actual device BV, the peak electric field is found near the corners of diffusion well 16 at breakdown due to the crowding of the electric field lines. It is believed that these localized regions of high electric field, which are near the small-radius curvature of diffusion well 16, generate "hot spots" that lead to avalanche failure.

TABLE 1

| Standard Epi Profile | | | | | |
|---|---|---|---|---|---|
| Epi thick [µm] | Epi res. (Ohm-cm) | Junction Depth (Xj) | Device BV [V] | One-d BV ("bulk" BV) [V] | Delta BV [V] |
| 30 | 12 | 6 | 344 | 383 | 39 |
| 34 | 12 | 6 | 356 | 426 | 70 |
| 30 | 14 | 6 | 350 | 386 | 36 |
| 34 | 14 | 6 | 377 | 442 | 65 |

It has also been found that FRED 10 having a linearly graded or double-profiled epitaxial layer 12 still has a device BV that is lower than an ideal bulk BV.

Referring to Table 2, for example, FRED 10 having a linearly graded epitaxial layer 12, and a 6 µm diffusion well 16 exhibits an actual device BV that is between 25-32V lower than the ideal bulk BV. Epitaxial layer 12 of FRED 10 of Table 2 has a linearly graded tail (Epi 2) with a concentration of dopants that is varied during the epitaxial growth and is kept constant during the final growth of the second layer (Epi 1). FIG. 1B shows a linearly graded epitaxial layer 12 graphically.

TABLE 2

| Graded Profile | | | | | | | |
|---|---|---|---|---|---|---|---|
| Epi 1 thick [µm] | Epi 1 Res (Ohm-cm) | Epi 2 Thick [µm] | Epi 2 Res (Ohm-cm) | Xj (µm) | Device BV [V] | One-d BV ("bulk" BV) [V] | Delta BV [V] |
| 15 | 20 | 15 | 20-1 | 6 | 300 | 325 | 25 |
| 15 | 20 | 15 | 20-4 | 6 | 352 | 384 | 32 |
| 15 | 20 | 15 | 20-6 | 6 | 365 | 392 | 27 |

Referring to Table 3, as yet another example, FRED 10 having a double-profiled epitaxial layer 12, and a 6 µm diffusion well 16 can have an actual device BV which is 27-28 volts less than the ideal bulk BV. Epitaxial layer 12 of FRED 10 of Table 3 has a first layer (Epi 2) of constant concentration and a second layer (Epi 1) of constant concentration. FIG. 1C shows a double-profiled epitaxial layer graphically.

TABLE 3

| Double Profile | | | | | | | |
|---|---|---|---|---|---|---|---|
| Epi 1 thick [µm] | Epi 1 Res (Ohm-cm) | Epi 2 Thick [µm] | Epi 2 Res (Ohm-cm) | Xj (µm) | Device BV [V] | One-d BV ("bulk" BV) [V] | Delta BV [V] |
| 15 | 20 | 15 | 3.5 | 6 | 315 | 343 | 28 |
| 15 | 20 | 15 | 8 | 6 | 354 | 381 | 27 |

Comparison of the data in Table 1, Table 2 and Table 3 indicates that by grading the profile of epitaxial layer 12, the difference between actual device BV and the ideal bulk BV can be reduced. However, the difference between the actual and the ideal breakdown voltages remains high for FRED 10 having a shallow 6 µm diffusion well. Moreover, the crowding of the electric field lines near the corners of diffusion well 16 is still observed in FRED 10 of Table 2 and Table 3. Thus, profile grading does not appear to strengthen the ability of FRED 10 to absorb the reverse avalanche energy.

Referring now to Table 4, diffusion well 16 of FRED 10 of Table 2 having a linearly graded profile was extended from 6 µm to 10 µm. In order to achieve a total bulk thickness of 30 µm, the Epi layer was thickened by 4 µm. As shown in Table 4, the increase in the depth of diffusion well 16 by 4 µm reduced the difference between the actual device BV and the ideal bulk BV.

TABLE 4

| Graded Profile | | | | | | | |
|---|---|---|---|---|---|---|---|
| Epi 1 thick [µm] | Epi 1 Res (Ohm-cm) | Epi 2 Thick [µm] | Epi 2 Res (Ohm-cm) | Xj (µm) | Device BV [V] | One-d BV ("bulk" BV) [V] | Delta BV [V] |
| 19 | 20 | 15 | 20-1 | 10 | 365 | 398 | 32 |
| 19 | 20 | 15 | 20-4 | 10 | 321 | 340 | 19 |
| 19 | 20 | 15 | 20-6 | 10 | 265 | 277 | 12 |

Further increases in the depth of diffusion well 16 from 15 μm to 20 μm in the epitaxial layer 12 of the device of Table 4 showed further reduction in the difference between actual device BV and ideal bulk BV. While this reduction between actual and ideal breakdown voltages is partly due to the thinning of the bulk thickness caused by the deepening of diffusion well 16, the deepening of diffusion well 16 has a substantial reducing effect on the difference between the actual and the ideal breakdown voltages. This reduction is believed to be due to the relaxation of the electric field lines as the radius of curvature near the corners of diffusion well 16 is increased, as well as, the spreading of the field lines toward the main portion of the PN junction (the junction between the diffusion well 16 and epitaxial layer 12), which helps to distribute the reverse avalanche energy over a wider area.

FIG. 2 shows FRED 24 having a 20 μm deep diffusion well 16 and a graded epitaxial layer 12 of very low doping level (approximately $1\times10^{14}$ cm$^3$). FRED 24 has an actual device BV which is only about 2.9 volts less than the ideal Bulk BV at 25° C. and about only 8.3 volts at 125° C. for 100 μA. Depending on the doping of epitaxial layer 12, FRED 10 (FIG. 1A) can have an avalanche voltage that changes by 25-40 volts when the temperature of the PN junction is raised from 25° C. to 125° C. It should be noted that corners of diffusion well 16 of FRED 24 are flatter and thus have a larger radius, which, it is believed, contribute to the capability of FRED 24 to absorb the reverse avalanche energy and increase the actual device BV of FRED 24.

To obtain a deep diffusion well 16, such as the one shown in FIG. 2, diffusion of dopants must be conducted at relatively high temperatures which may be in the order of 1250° C. or higher, and typically for a long drive-in time. In contrast, shallower diffusion well 16, such as the one shown by FIG. 1A may be obtained at considerably lower temperatures, which may be in the order of about 1100° C., and for a shorter drive-in time. Given that many fabrication laboratories do not have the capability for deep diffusion at high temperatures, it is desirable to have an alternative device, which does not require a high temperature diffusion step, that is capable of absorbing the reverse avalanche energy of a FRED having a deep diffusion well 16, such as FRED 24 of FIG. 2.

SUMMARY OF THE INVENTION

A semiconductor device according to the present invention is an MPS capable of absorbing the reverse avalanche energy absorbed by a FRED 24 (e.g. FIG. 2) having a deep diffusion well 16.

MPS devices are known. U.S. Pat. No. 4,862,229 shows an MPS type device in which oppositely doped diffusions are integrated with a Schottky structure. The conventional thinking in the design of prior art MPS devices is to space the diffusions as close as possible so that under the reverse bias condition the depletion layers around the diffusions link up quickly to improve the breakdown voltage of the device. It has been found, however, that contrary to conventional thinking, in an MPS having shallow diffusion stripes, spacing the diffusions wider apart improves the absorption of reverse avalanche energy and thus improves the ability of the device to withstand breakdown under reverse bias conditions. Specifically, it has been found that by appropriate adjustment of the distance between the diffusion stripes in an MPS, shallower diffusions can be used to achieve the same ability to withstand breakdown as a prior art device with a deeper diffusion well. Thus, with lower temperature processing (and thus lower cost) a device can be obtained that exhibits the same or comparable characteristics as a device manufactured by a higher temperature process (and thus higher cost).

An MPS according to the present invention include an array of P+ diffusion stripes each spaced from at least one other adjacently disposed stripe. According to the present invention, the distance between each stripe has been set so that the capability of the MPS device to withstand breakdown under reverse bias condition is adapted to be close to that of a FRED with a deeper diffusion well.

The stripes in an MPS according to the present invention may be diffused to a depth of about 5 μm at a relatively low temperature of about 1100° C., and spaced apart up to 19 μm above which the practical advantages of spacing the stripes farther from each other are diminished or lost.

Other features and advantages of the present invention will become apparent from the following description of the invention which refers to the accompanying drawings.

DETAILED DESCRIPTION OF THE DRAWINGS

Figure 3:
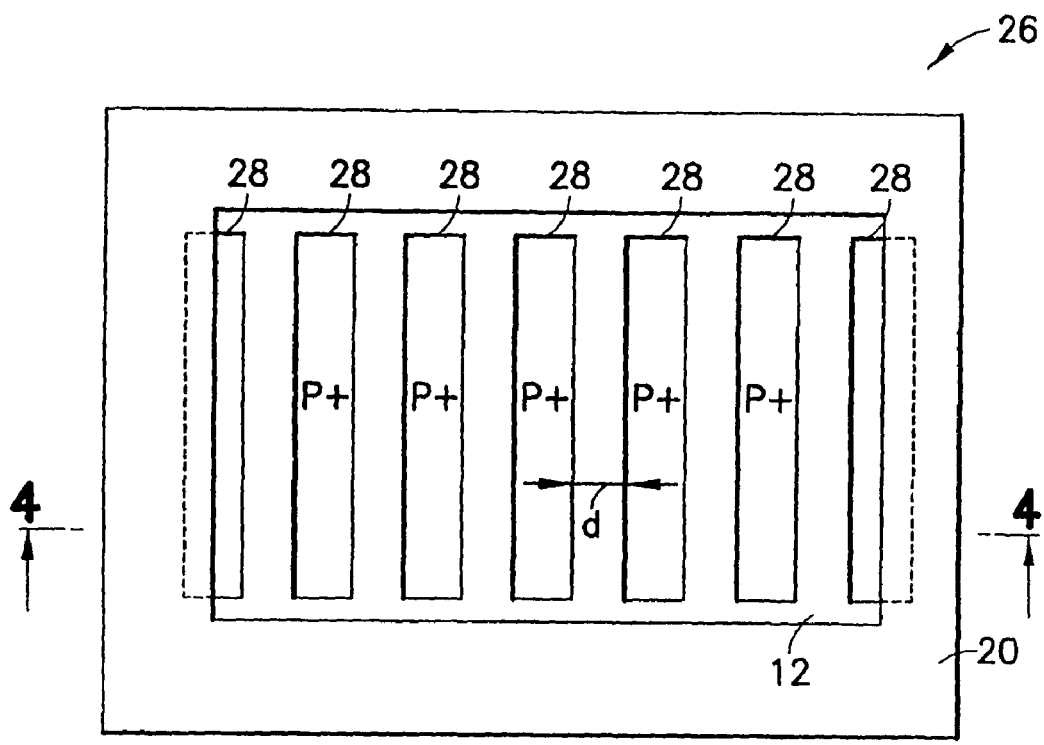
FIG. 3 is a top view of an MPS according to the present invention with the top contact removed from the view for better illustration.
Figure 4:
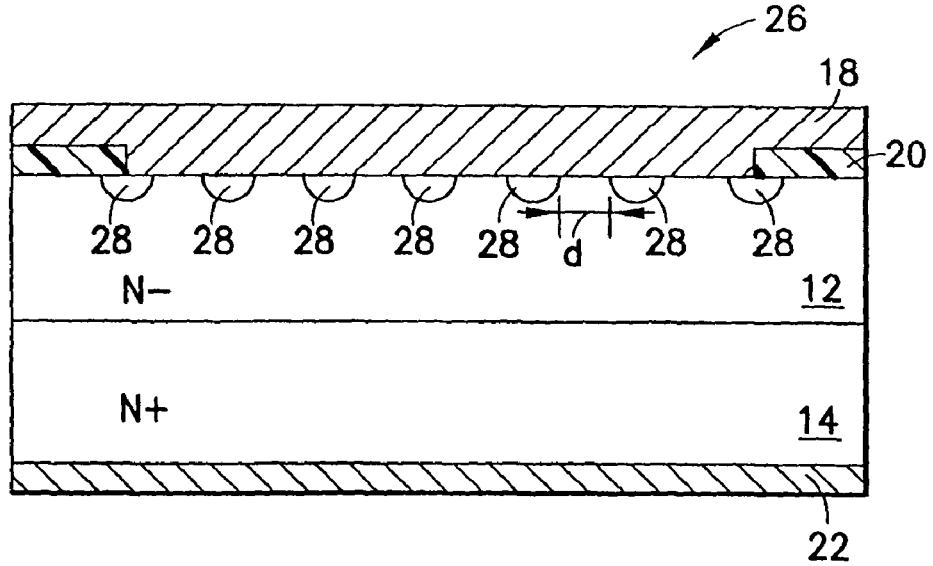
FIG. 4 is a cross-sectional view of FIG. 3 along line 4-4 viewed in the direction of the arrows.

Referring to FIGS. 3 and 4, where like numerals indicate like features, MPS 26 according to a preferred embodiment of the present invention includes a plurality of P+ doped diffusion stripes 28 formed in N⁻ doped silicon substrate 14. Diffusion stripes 28 are spaced from one another by a distance "d" which may be increased to increase the ability of MPS 26 to absorb the reverse avalanche energy, and may be only 5 μm deep. First major electrode 18 forms a Schottky contact with epitaxial layer 12 that is exposed between stripes 28, thereby forming an MPS structure.

Figure 5:
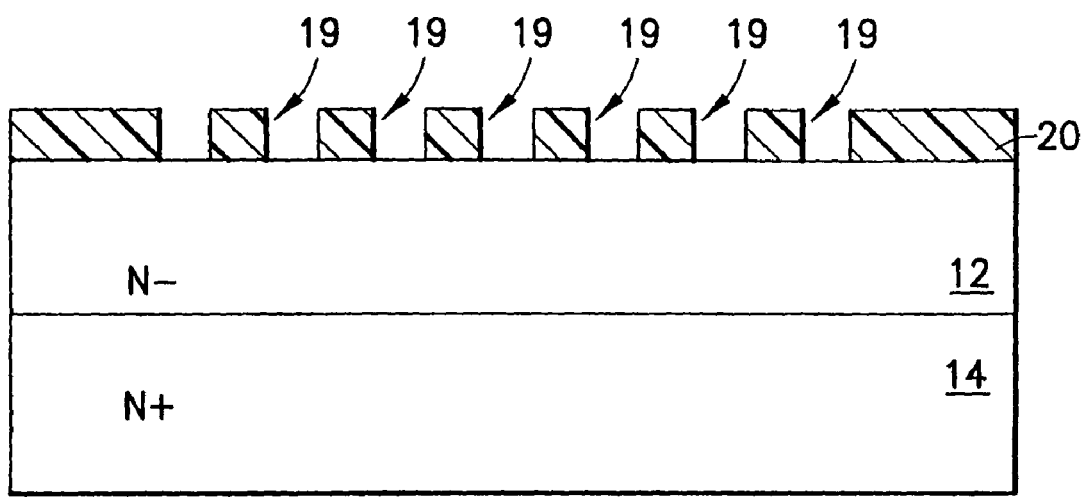
FIGS. 5 and 6 illustrate processing steps for manufacturing an MPS according to the present invention.
Figure 6:
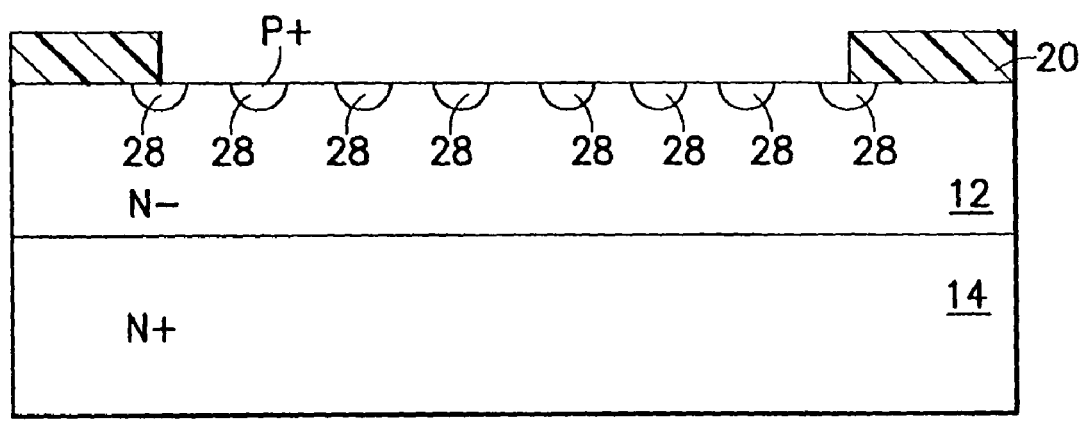

Referring now to FIGS. 5-6, MPS 26 (FIG. 4) may be manufactured by first epitaxially growing an N⁻ doped silicon layer 12 over an N+ doped silicon substrate 14. Next, oxide layer 20 is either grown or deposited on N⁻ doped epitaxial layer 12. Multiple windows 19 are then opened in oxide layer 20 in a photolithographic step, and P+ doped diffusion stripes 28 are formed in the top surface of N⁻ doped epitaxial layer 12 by implanting dopants through windows 19. Next, the oxide over P+ doped diffusions 28 is removed.

Subsequently, first major electrode 18 is deposited over the opening in oxide layer 20 to make contact with diffusion stripes 28, epitaxial layer 12 in the spaces between diffusion stripes 28 and at least portions of silicon dioxide layer 20. Second major electrode 22 is also deposited on silicon substrate 14 opposite to first major electrode 18 to obtain MPS 26 as shown in FIG. 4.

According to an aspect of the present invention, diffusion stripes 28 may be formed at a relatively low temperature of about 1100° C. for a short time of about 6 hours, to a relatively shallow depth of about 5 µm, and spaced by a distance "d". The distance "d" between diffusion stripes 28 may be increased as desired to improve the ability of the device to absorb the reverse avalanche energy in MPS 26.

In the preferred embodiment, edges of the opening in oxide layer 20 may lie over the outermost stripes 28.

Also, the thickness and the doping concentration of epitaxial layer 12, as well as, the distance between diffusion stripes 28 may be varied to obtain various embodiments of MPS 26 according to the present invention.

MPS 26, according to the first embodiment, includes diffusion stripes 28 spaced 8 µm apart, the second embodiment includes diffusion stripes 28 spaced 12 µm apart and the third embodiment includes diffusion stripes 28 that are spaced 18 µm apart. Each embodiment may have an epitaxial layer 12 which is 30 µm thick and is doped to have a resistivity of about 12 ohms/cm or an epitaxial layer 12 which is 30 µm thick and is doped to have a resistivity of about 11 ohms/cm.

Figure 1A:
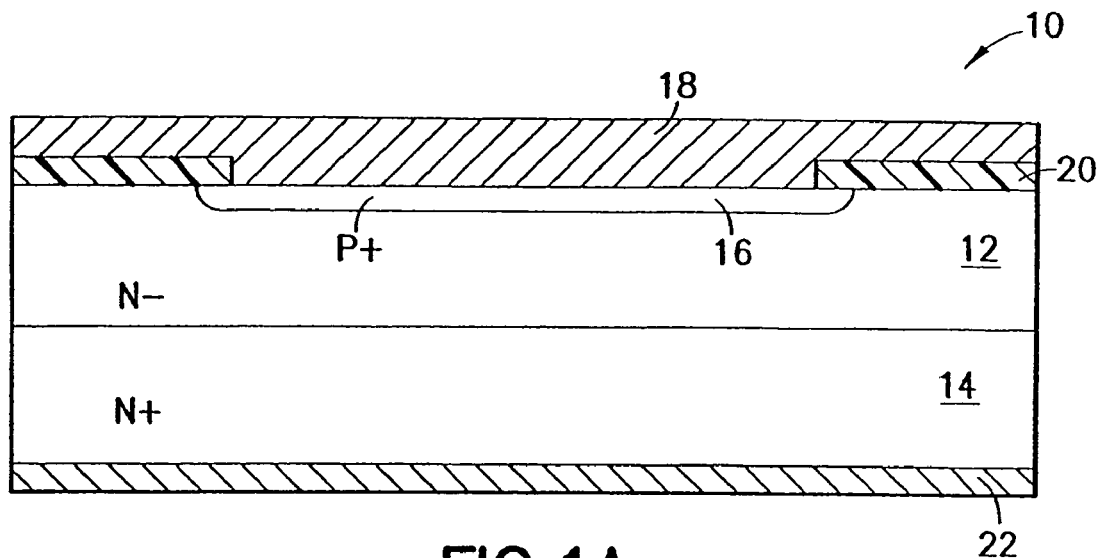
FIG. 1A is a cross-sectional view of the active region of a prior art FRED.
Figure 2:
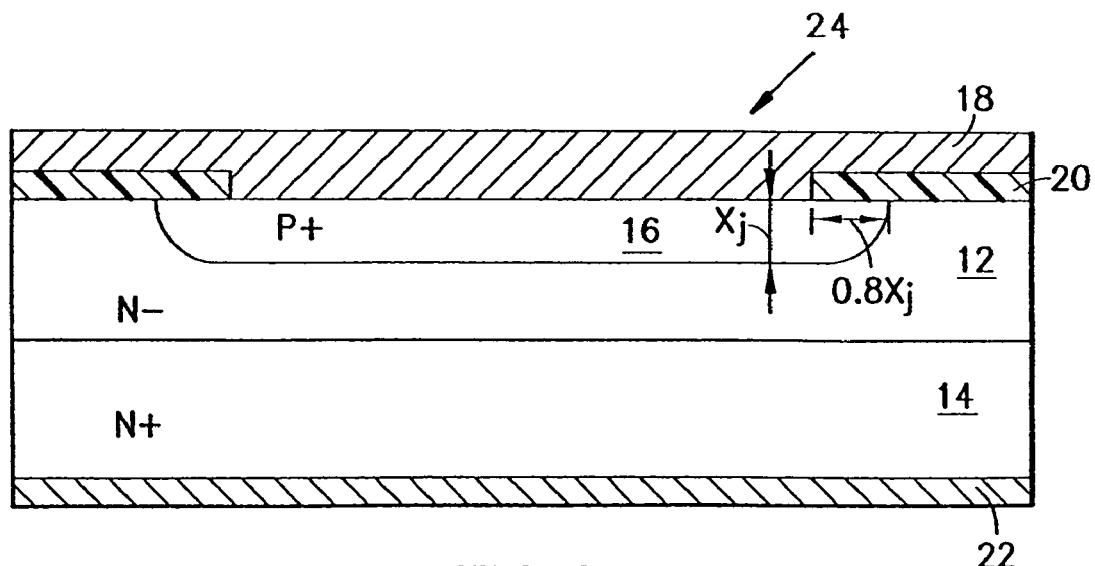
FIG. 2 is a cross-sectional view of the active region of another prior art FRED.
Figure 1B:
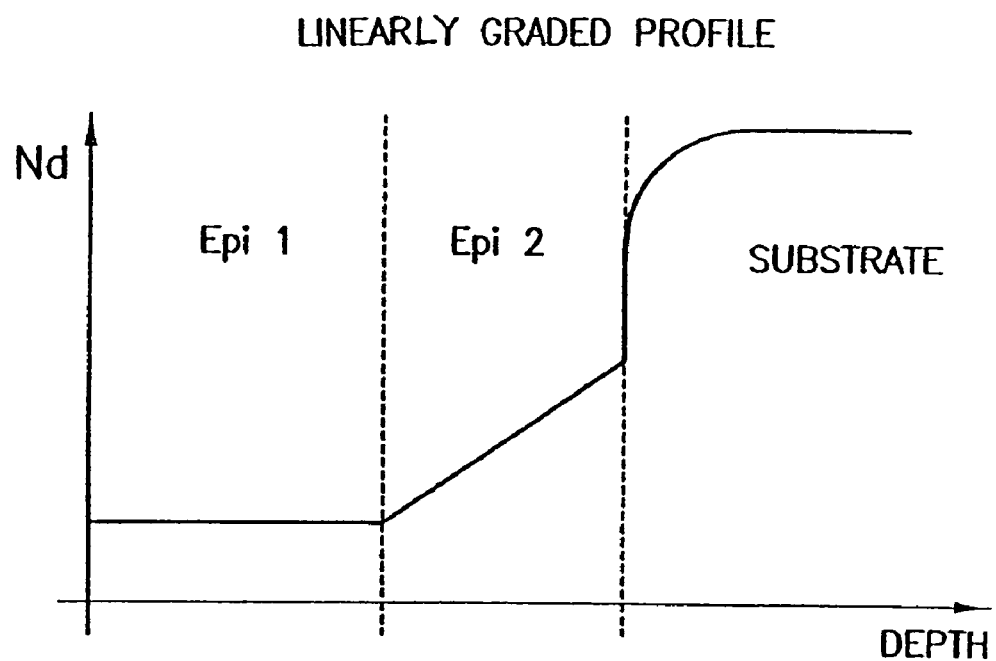
FIG. 1B is a graphical illustration of the doping profile in a linearly graded epitaxial layer.
Figure 1C:
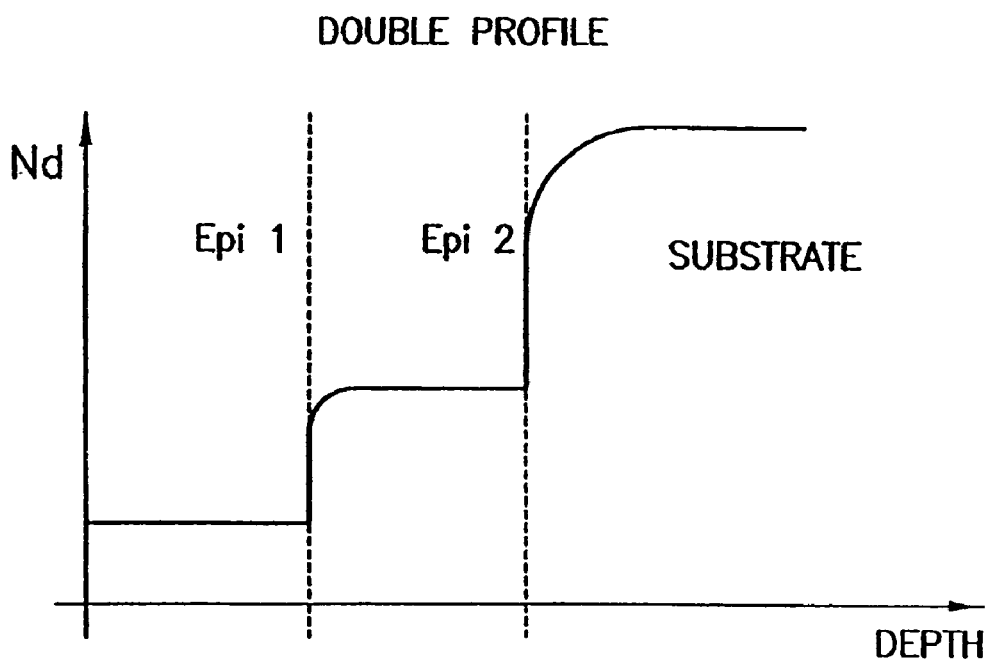
FIG. 1C is a graphical illustration of the doping profile in a double-profiled epitaxial layer.
Figure 7:
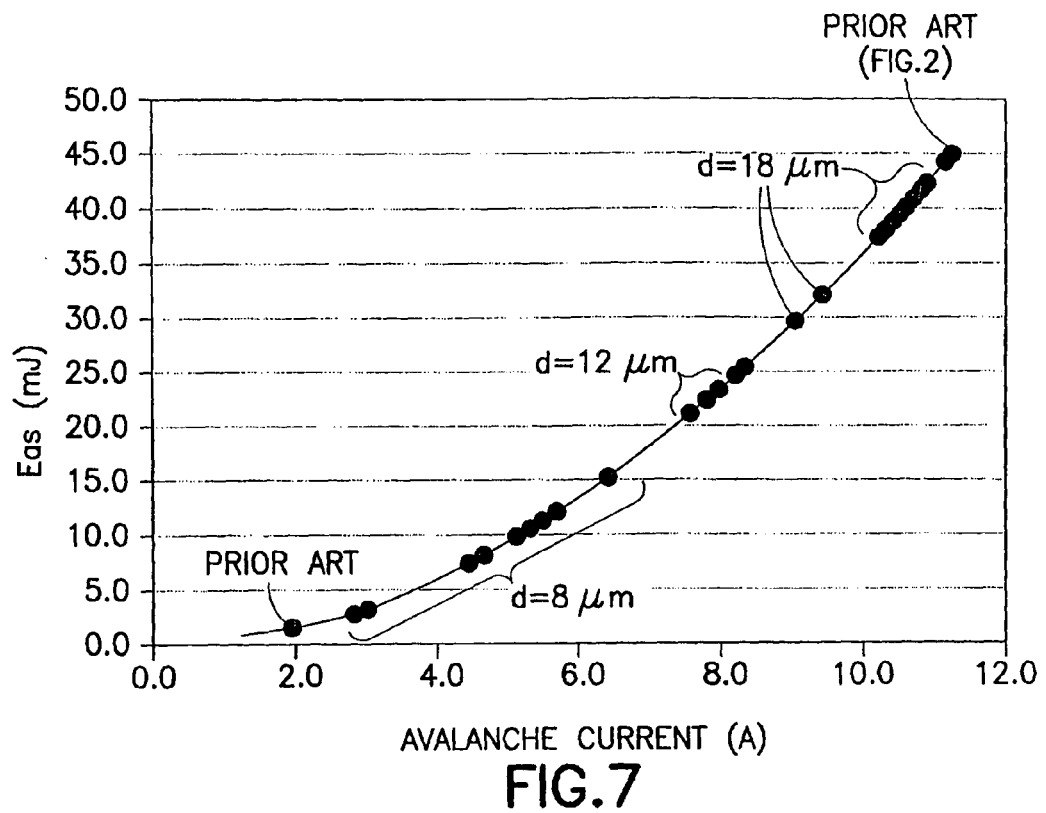
FIG. 7 shows a graphical illustration of the reverse avalanche capability of several embodiments of the present invention.

Referring to FIG. 7, it is shown that as distance "d" between diffusion stripes 28 is increased MPS 26 becomes more capable of absorbing reverse avalanche energy. For example, as distance "d" is increased from about 8 µm to about 18 µm, reverse avalanche energy of MPS 26 is increased from about 7.5 mJ to about 37.5 mJ. This is a comparable avalanche energy to prior art devices with deep p-well (FIG. 2) which may exhibit an avalanche energy of about 50 mJ (n12A).

Figure 8:
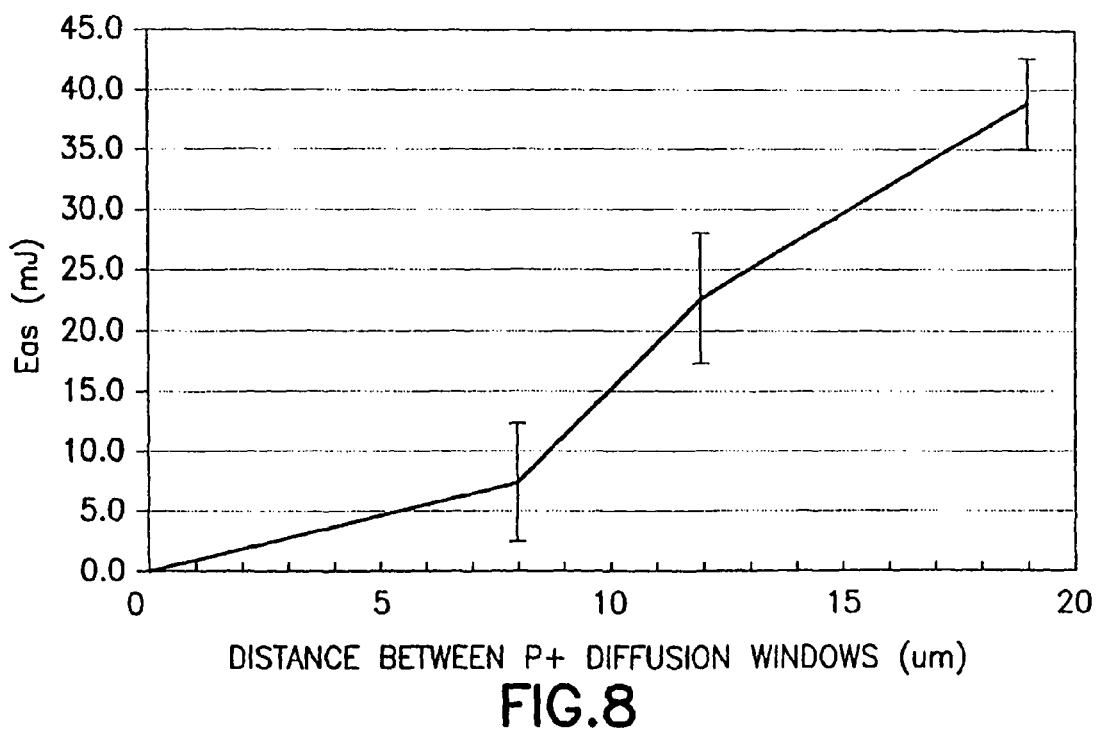
FIG. 8 shows a graphical illustration of the relationship between the spacing of the diffusion regions in an MPS according to the present invention and reverse avalanche energy.

Referring to FIG. 8, it is shown that as distance "d" between diffusion stripes 28 is increased MPS 26 can absorb a larger avalanche current and thus a larger reverse avalanche energy.

Other experiments have shown that a device according to the present invention exhibits a slightly higher leakage current than a comparable prior art device. The increase in the leakage current was found, however, to be within acceptable design limits. Also, a device according to the present invention was found to exhibit a breakdown voltage capability similar to prior art devices, reverse recovery comparable to prior art devices, and a forward voltage drop comparable to prior art devices. However, a device according to the present invention was advantageously manufactured to have diffusion stripes that extend to a lower depth than the diffusion well in a prior art device (FIG. 2) of comparable characteristics. Thus, a device according to the present invention can be manufactured using lower diffusion temperature and/or lower drive-in time for boron (P+ type diffusion) drive-in at a lower cost, compared to a functionally comparable prior art device.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for manufacturing a semiconductor device, said method comprising:
    forming a plurality of stripes of one conductivity type having a first depth in a semiconductive body of another conductivity type, wherein each of said plurality of stripes is spread apart by a threshold distance from at least one adjacent one of said plurality of stripes, wherein a position of each of said plurality of stripes increases absorption of reverse avalanche energy by said semiconductor device; and
    forming a Schottky contact layer over said semiconductive body, wherein said Schottky contact layer is in contact with said plurality of stripes, and wherein said Schottky contact layer is further in contact with each region disposed between said plurality of stripes.

2. A method according to claim 1, wherein said threshold distance is eight microns.

3. A method according to claim 1, wherein said threshold distance is twelve microns.

4. A method according to claim 1, wherein said threshold distance is eighteen microns.

5. A method according to claim 1, wherein said threshold distance ranges between eight microns and nineteen microns.

6. A method according to claim 1, wherein said first depth is five microns.

7. A method according to claim 1, wherein a thickness of said semiconductive body at a first stripe of said plurality of stripes is different from a thickness of said semiconductor body at a second stripe of said plurality of stripes.

8. A method according to claim 1, wherein a doping concentration of said semiconductive body at a first stripe of said plurality of stripes is different from a doping concentration of said semiconductor body at a second stripe of said plurality of stripes.

9. A method according to claim 1, wherein said plurality of stripes is doped with $P^+$ impurities and said semiconductive body is an epitaxial layer on $N^-$ doped silicon substrate.

10. A method according to claim 1, said forming said plurality of stripes is performed at a temperature of about 1100 degrees Celsius for about 6 hours.

11. A method according to claim 1, wherein said semiconductor device exhibits substantially similar reverse avalanche energy absorption characteristics as a Fast Recovery Epitaxial Diode having a diffusion well significantly deeper than said first depth.

12. A method for manufacturing a merged P-i-N Schottky structure, comprising:
    forming a plurality of P+ doped diffusion stripes in N– doped silicon substrate, wherein said plurality of P+ doped diffusion stripes are spaced apart by a distance, wherein said distance increases absorption of a reverse avalanche energy; and
    forming a first electrode which makes a Schottky contact with each surface of surfaces of said N-doped silicon substrate exposed between said P+ doped diffusion stripes.

13. The method of claim 12, wherein a depth of each of said plurality of P+ doped diffusion stripes is approximately 5 microns.

14. The method of claim 12, wherein said forming said plurality of P+ doped diffusion stripes comprising:
    expitaxially growing said N– doped silicon substrate over an N+ doped silicon substrate;
    depositing an oxide layer on said N– doped silicon substrate;
    forming a plurality of windows via said oxide layer;

implanting dopants to said N− doped silicon substrate via said plurality of windows; and removing portions of said oxide layer formed over said plurality of P+ doped diffusion stripes.

15. The method of claim 12, wherein said forming said plurality of P+ doped diffusion stripes further comprises determining said distance to obtain a desired amount of said reverse avalanche energy.

16. The method of claim 12, wherein said N− doped silicon substrate is 30 microns in thickness and is doped to have a resistivity of approximately 12 ohms/cm.

17. The method of claim 12, wherein said N− doped silicon substrate is 30 microns in thickness and is doped to have a resistivity of approximately 11 ohms/cm.

* * * * *